(12) United States Patent
Yoshizawa et al.

(10) Patent No.: US 7,479,826 B2
(45) Date of Patent: Jan. 20, 2009

(54) CHOPPER AMPLIFIER CIRCUIT AND SEMICONDUCTOR DEVICE

(75) Inventors: Hirokazu Yoshizawa, Fukaya (JP); Ryoichi Anzai, Chiba (JP); Toshiyuki Uchida, Chiba (JP); Minoru Ariyama, Chiba (JP); Atsushi Igarashi, Chiba (JP); Akira Takeda, Chiba (JP)

(73) Assignees: Seiko Instruments Inc., Chiba (JP); Gakkouhoujin Chikoujigakuen, Saitama (JP)

( * ) Notice: Subject to any disclaimer, the term of this patent is extended or adjusted under 35 U.S.C. 154(b) by 19 days.

(21) Appl. No.: 11/499,357

(22) Filed: Aug. 4, 2006

(65) Prior Publication Data

US 2007/0146065 A1 Jun. 28, 2007

(30) Foreign Application Priority Data

Aug. 8, 2005 (JP) .............................. 2005-229501

(51) Int. Cl.
*H03F 1/02* (2006.01)
(52) U.S. Cl. ............................................. 330/9; 330/69
(58) Field of Classification Search ........................ None
See application file for complete search history.

(56) References Cited

U.S. PATENT DOCUMENTS

| | | | | |
|---|---|---|---|---|
| 2,866,018 A | * | 12/1958 | Bell ................................ 330/9 |
| 6,262,626 B1 | | 7/2001 | Bakker et al. |
| 6,657,488 B1 | * | 12/2003 | King et al. ..................... 330/9 |
| 6,674,322 B2 | * | 1/2004 | Motz ............................. 330/9 |
| 6,734,723 B2 | * | 5/2004 | Huijsing et al. ................ 330/9 |
| 7,023,266 B2 | * | 4/2006 | Chung ........................... 330/9 |
| 7,132,883 B2 | * | 11/2006 | Huijsing et al. ................ 330/9 |
| 7,292,095 B2 | * | 11/2007 | Burt et al. ...................... 330/9 |

OTHER PUBLICATIONS

P. Allen and D.R. Holberg, "CMOS Analog Circuit Design," pp. 490-495, Saunders College Publishing, 1987.

* cited by examiner

*Primary Examiner*—Robert Pascal
*Assistant Examiner*—Alan Wong
(74) *Attorney, Agent, or Firm*—Brinks Hofer Gilson & Lione

(57) ABSTRACT

Provided is a chopper amplifier circuit capable of reducing an offset voltage of a sensor bridge and temperature characteristics of the offset voltage. An offset adjusting voltage generation circuit for generating a voltage equal to an offset voltage of a sensor bridge and an offset temperature characteristics adjusting voltage generation circuit for generating a voltage having temperature characteristics equal to those of the offset voltage are provided. These output voltages are chopper-modulated and subtracted from a chopper-modulated output signal of the sensor bridge.

7 Claims, 7 Drawing Sheets

CHOPPER AMPLIFIER CIRCUIT AND SEMICONDUCTOR DEVICE

This application claims priority under 35 U.S.C. §119 to Japanese Patent Application No. JP2005-229501 filed Aug. 5, 2005, the entire content of which is hereby incorporated by reference.

BACKGROUND OF THE INVENTION

1. Field of the Invention

The present invention relates to a chopper amplifier circuit and a semiconductor device having the chopper amplifier circuit.

2. Description of the Related Arts

FIG. 2 is a block diagram showing a conventional chopper amplifier circuit. In the conventional chopper amplifier circuit 20, multipliers 11 and 12 are provided in front and back stages of an amplifier circuit 1, respectively. The multipliers 11 and 12 are controlled with a modulation signal CLK in a square wave with a frequency fc. The output of the chopper amplifier circuit 20 is connected to a low-pass filter 22 (see P. Allen and D. R. Holberg, CMOS Analog Circuit Design, P490-494, Saunders College Publishing, 1987).

FIGS. 3A to 3F show frequency characteristics of an input signal in each portion of the conventional chopper amplifier circuit. It is assumed that an input signal has frequency characteristics as shown in FIG. 3A at input terminals 5 of the chopper amplifier circuit 20. Further, it is assumed that the amplifier circuit 1 has an input conversion noise and an offset voltage Vn of the frequency characteristics as shown in FIG. 3C. After the input signal passes through the multiplier 11, the input signal is modulated to a frequency that is an odd multiple of the frequency fc of the modulation signal CLK. FIG. 3B shows frequency characteristics of the input signal at this time. The modulated input signal is amplified and output after being supplied with the input conversion noise and the offset voltage Vn of the amplifier circuit 1. FIG. 3D shows frequency characteristics of the input signal at the output of the amplifier circuit 1. The input signal output from the amplifier circuit 1 is modulated to an original frequency band (i.e., a low-frequency region including a DC) through the multiplier 12. On the other hand, the noise component and the offset voltage Vn at the input of the amplifier circuit 1 are modulated to a frequency of an odd multiple of the frequency fc of the modulation signal CLK. FIG. 3E shows frequency characteristics of an input signal at the output of the multiplier 12. Further, the input signal output from the multiplier 12 passes through the low-pass filter 22, whereby a high frequency component of the modulation signal CLK is removed. Thus, as shown in FIG. 3F, only an input signal component can be amplified without amplifying the noise and offset voltage of the amplifier circuit 1.

Further, in another conventional chopper amplifier circuit, an input signal is subjected to double chopper modulation using modulation signals with two different frequencies, whereby the noise and the offset voltage of an amplifier circuit used in a chopper amplifier circuit are further reduced (see U.S. Pat. No. 6,262,626, Bakker, et al., Jul. 17, 2001).

However, the conventional chopper amplifier circuit has the following problems. When the conventional chopper amplifier circuit is used, for example, for amplifying the output voltage of a sensor bridge using a piezoresistor, the offset voltage of the sensor bridge cannot be cancelled due to incomplete matching of the piezoresistor. Therefore, the offset voltage of the sensor bridge is amplified to be output.

Further, the offset voltage of the sensor bridge using the piezoresistor has temperature characteristics, and the temperature characteristics of the offset voltage appear in the output voltage of the chopper amplifier circuit.

SUMMARY OF THE INVENTION

In order to solve the above-mentioned problems, the present invention has a configuration in which a circuit for generating a voltage equal to an offset voltage of a sensor bridge, i.e., an offset adjusting voltage generation circuit is provided, and the output voltage of the offset adjusting voltage generation circuit is chopper-modulated by a multiplier, whereby the output signal of the sensor bridge is subtracted from the chopper-modulated signal.

Further, the present invention has a configuration in which a circuit for generating a voltage having temperature characteristics equal to those of the offset voltage of the sensor bridge, i.e., an offset temperature characteristics adjusting voltage generation circuit is provided, and the output voltage of the circuit is chopper-modulated and subtracted from the output signal of the sensor bridge subjected to chopper modulation.

In the chopper amplifier circuit configured as described above, the offset voltage of the sensor bridge and the output voltage of the offset adjusting voltage generation circuit cancel each other, whereby the offset voltage of the sensor bridge can be cancelled.

Further, the temperature characteristics of the offset voltage of the sensor bridge and the temperature characteristics of the output voltage of the offset temperature characteristics adjusting voltage generation circuit cancel each other, whereby the temperature characteristics of the offset voltage of the sensor bridge can be cancelled.

DESCRIPTION OF THE PREFERRED EMBODIMENTS

First Embodiment

Figure 1:
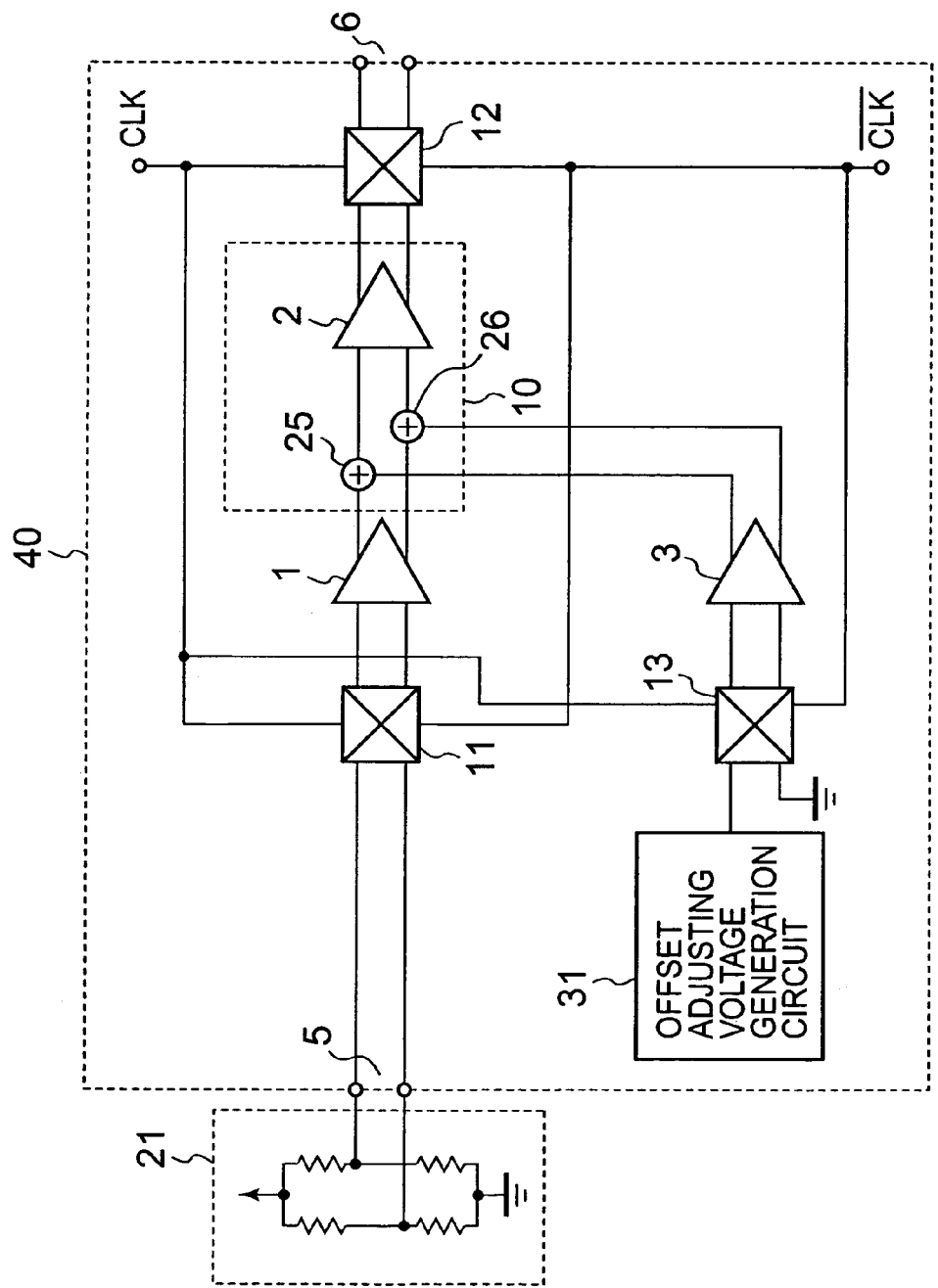
FIG. 1 is a block diagram of a chopper amplifier circuit of a first embodiment according to the present invention.
Figure 2:
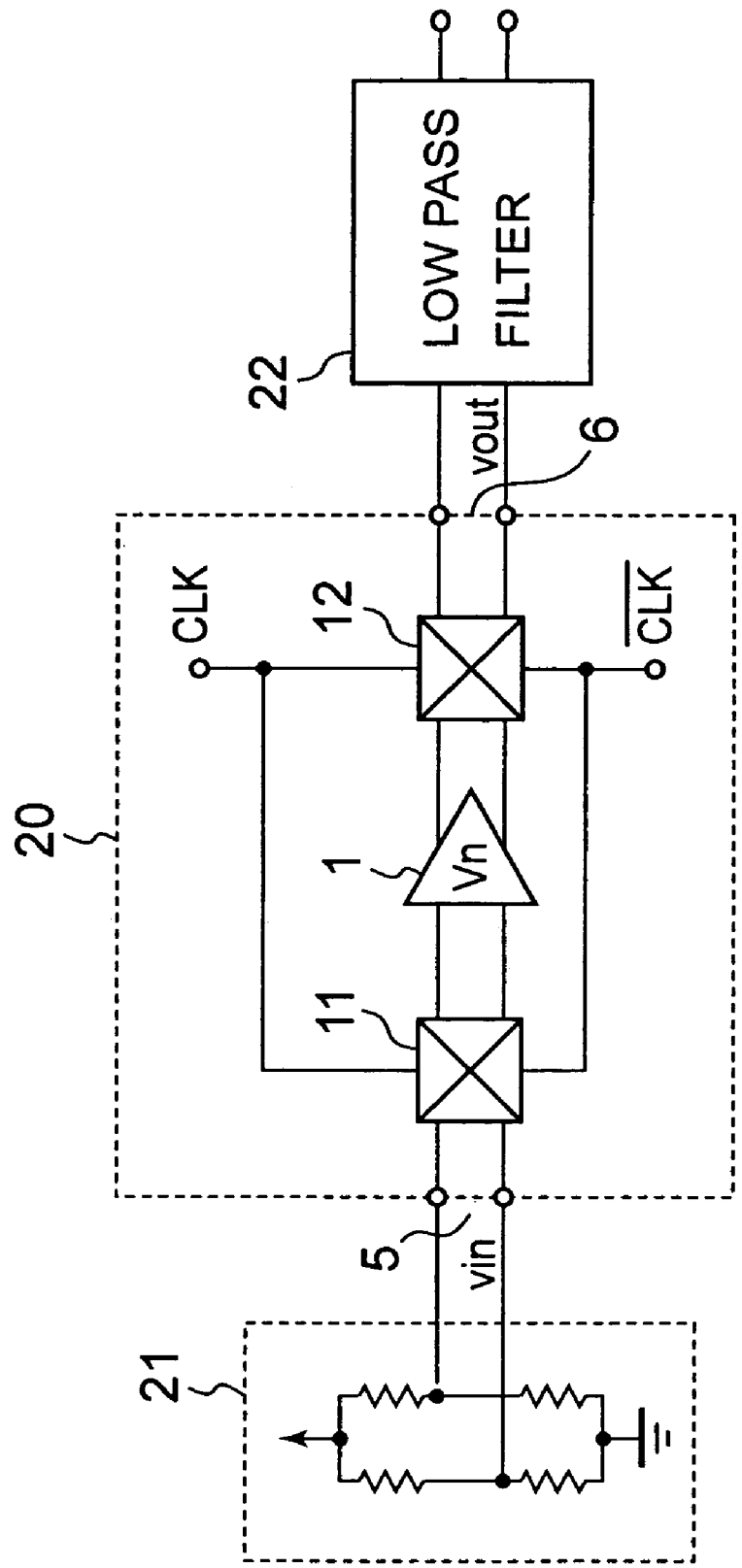
FIG. 2 is a block diagram of a conventional chopper amplifier circuit.
Figure 3A:
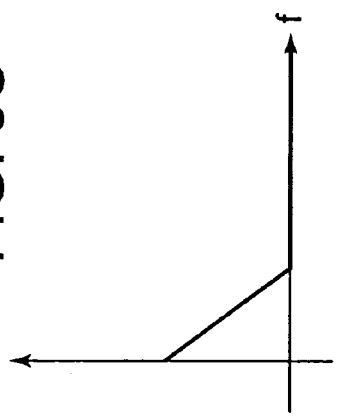
FIGS. 3A-3F are waveform diagrams of the conventional chopper amplifier circuit.
Figure 3B:
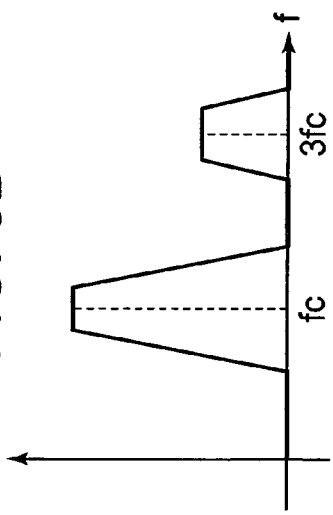
Figure 3C:
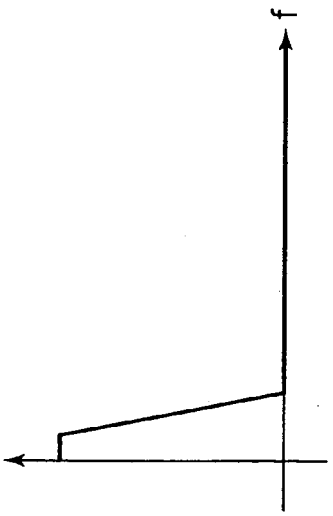
Figure 3D:
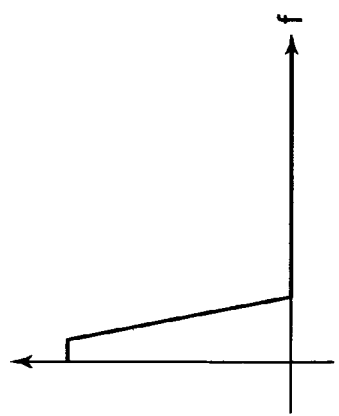
Figure 3E:
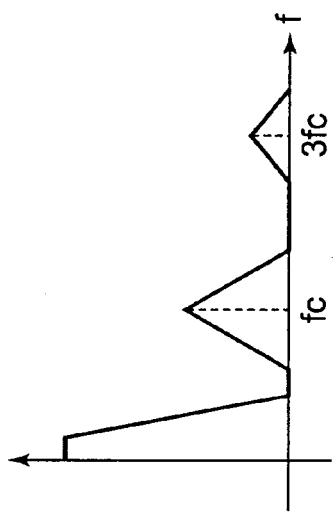
Figure 3F:
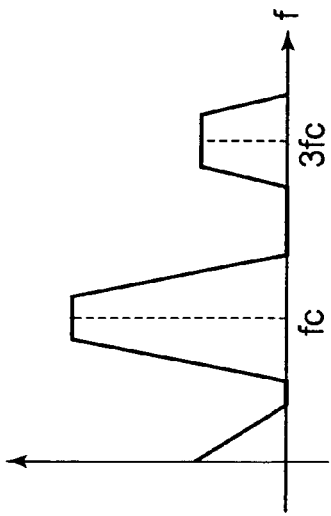

FIG. 1 is a block diagram of a chopper amplifier circuit of a first embodiment according to the present invention.

A chopper amplifier 40 receives sensor signals output from a sensor bridge 21 at input terminals 5, and outputs amplified signals from output terminals 6. The sensor signal input to the input terminals 5 is chopper-modulated with a modulation signal CLK in a multiplier 11, and then amplified in an amplifier circuit 1. An offset adjusting voltage generation circuit 31 generates an offset adjusting voltage that is equal in magnitude to and has a polarity opposite to an offset voltage of the sensor bridge 21. The offset adjusting voltage is chopper-modulated with the modulation signal CLK in the multiplier 13 to be amplified in the amplifying circuit 3. Adders 25 and 26 add the above-mentioned sensor signal to the offset adjusting voltage, thereby canceling the offset voltage of the sensor bridge 21 in the sensor signal. Further, the sensor signal is amplified in the amplifying circuit 2, and chopper-modulated with the modulation signal CLK in the multiplier 12 to be modulated to an original frequency band (i.e., low frequency region including a DC).

Herein, the reason for using two adders 25 and 26 is to handle differential outputs of the amplifying circuits 1 and 3.

According to the above-mentioned method of canceling the offset voltage of the sensor bridge, the offset adjusting voltage was used, which is equal in magnitude to and has a polarity opposite to the offset voltage of the sensor bridge 21 generated by the offset adjusting voltage generation circuit 31. However, the offset adjusting voltage generation circuit 31 may be allowed to generate an offset adjusting voltage that is equal in magnitude to and has a polarity equal to the offset voltage of the sensor bridge 21, and the offset modulation voltage may be chopper-modulated with a signal obtained by shifting the phase of the modulation signal CLK by 180° in the multiplier 13.

In order to allow the offset adjusting voltage generation circuit 31 to generate a voltage that is equal in magnitude to the offset voltage of the output of the sensor bridge 21, a high-frequency component may be removed by connecting a low-pass filter to the output terminal 6, and the output of the offset voltage adjusting circuit 31 may be adjusted so that the potential of the output of the low-pass filter becomes 0.

Figure 4:
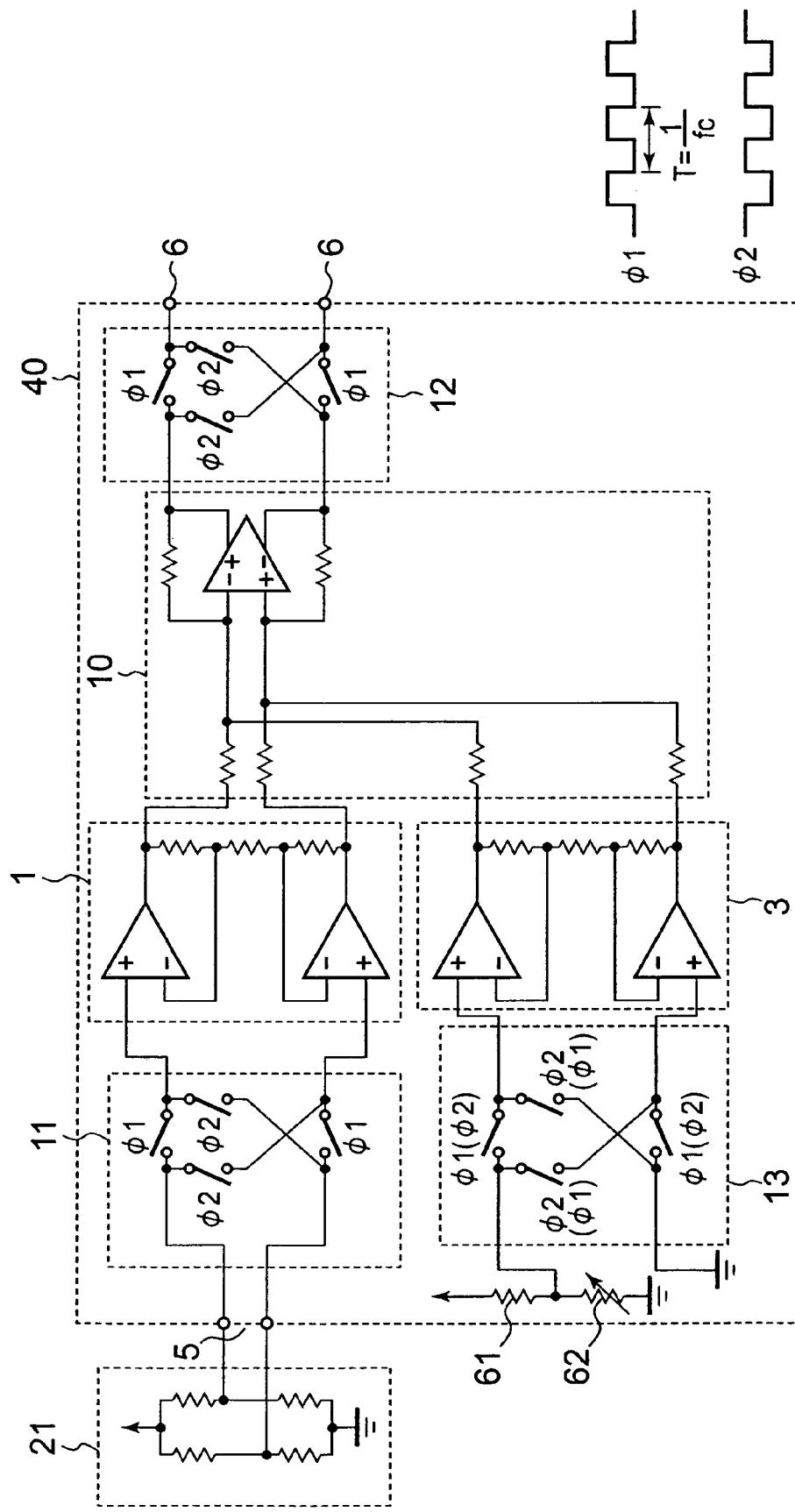
FIG. 4 is a circuit diagram of a chopper amplifier circuit of the first embodiment according to the present invention.

FIG. 4 shows a circuit diagram of the chopper amplifier circuit of the present invention. The multipliers 11, 12, and 13 are respectively composed of four switches. The switches can be realized by an N-channel MOS transistor or a CMOS transistor (in which the N-channel MOS transistor and the P-channel MOS transistor are connected in parallel). The amplifiers 1 and 3 have an instrumentation amplifier configuration, whereby an input impedance can be set to be significantly high. Therefore, a sensor bridge using a piezoresistor is not influenced.

The adders 25 and 26 shown in FIG. 1 are integrated with the amplifying circuit 2 to be realized as a part of an adder amplifier circuit 10. The adder amplifier circuit 10 is composed of a plurality of resistors and operational amplifiers.

In a configuration of the offset adjusting voltage generation circuit 31, as an example, a fixed resistor and a variable resistor are used. A resistor 61 represents a fixed resistor, and a resistor 62 represents a variable resistor. By changing the resistor 62, the output voltage of the offset adjusting voltage generation circuit 31 can be changed by changing the resistor 62 so that the offset voltage of a sensor bridge can be cancelled.

The circuit shown in FIG. 4 is an example obtained by realizing the circuit configuration shown in FIG. 1, and the present invention is not limited to the circuit configuration shown in FIG. 4.

Second Embodiment

Figure 5:
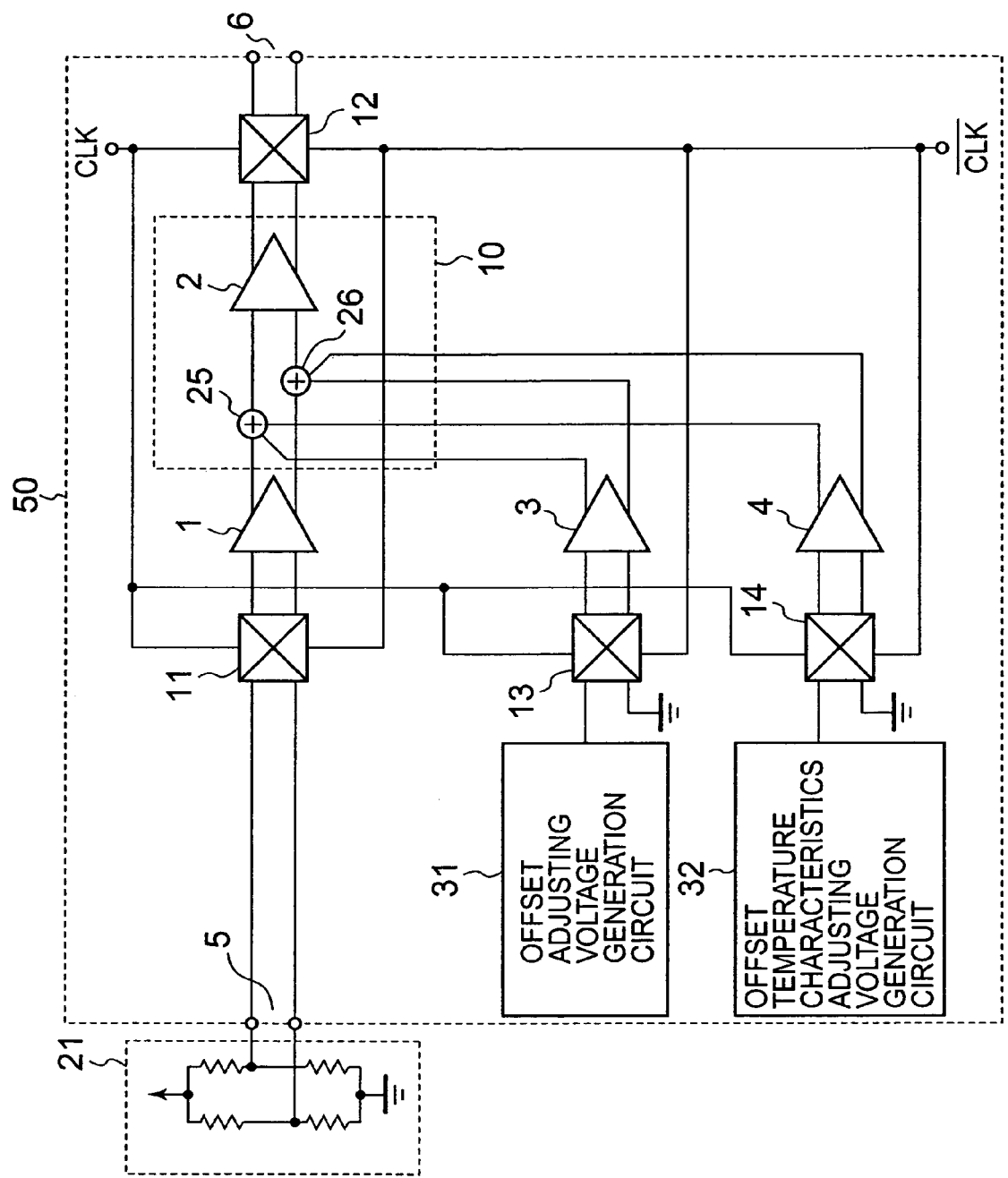
FIG. 5 is a block diagram of a chopper amplifier circuit of a second embodiment according to the present invention.

FIG. 5 is a block diagram of a chopper amplifier circuit of a second embodiment according to the present invention.

Figure 7:
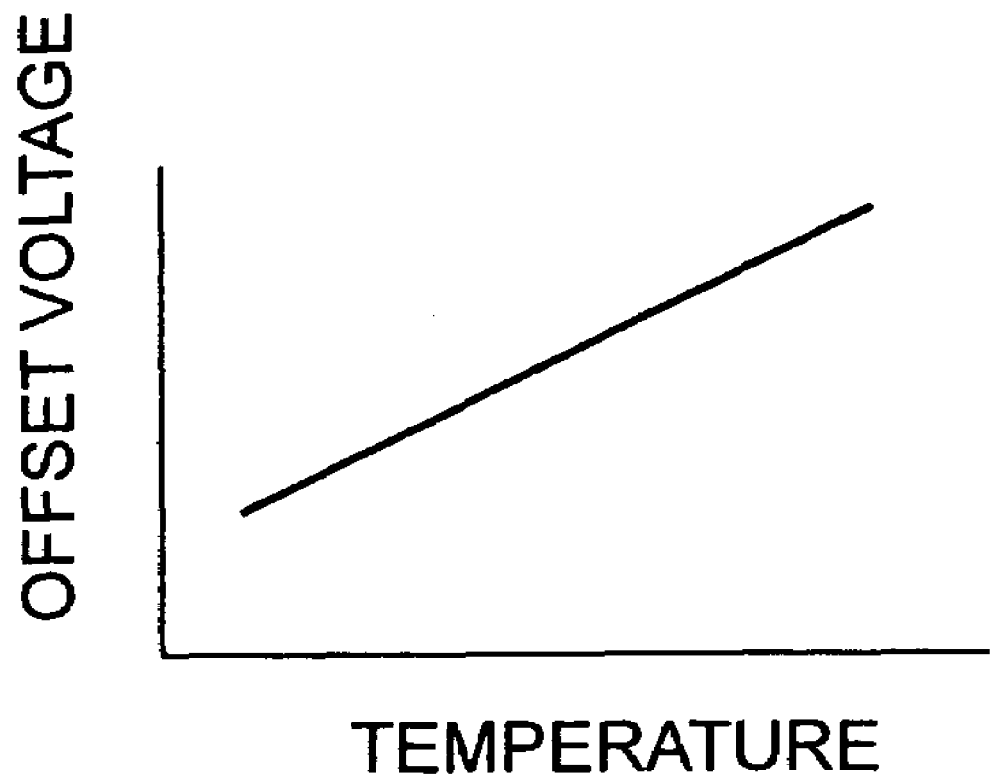
FIG. 7 shows an example of temperature characteristics of an offset voltage of a sensor bridge.

In general, an offset voltage of a sensor bridge has temperature characteristics. Herein, as an example, it is assumed that the offset voltage of the sensor bridge has temperature characteristics as shown in FIG. 7.

In the second embodiment, in addition to the chopper amplifier circuit of the first embodiment, an offset temperature characteristics adjusting voltage generation circuit 32 is provided. The offset temperature characteristics adjusting voltage generation circuit 32 outputs an offset temperature characteristics adjusting voltage having characteristics equal to the temperature characteristics of the offset voltage of the sensor bridge. The offset temperature characteristics adjusting voltage is chopper-modulated by the multiplier 14 and amplified by an amplifying circuit 4, and then, added to a chopper-modulated sensor output signal by the adders 25 or 26. At this time, the output of the offset temperature characteristics adjusting voltage generation circuit 32 of the sensor bridge is also added to the sensor output signal chopper-modulated by the adders 25 and 26 through the multiplier 13 and the amplifying circuit 3. Thus, the offset voltage of the sensor bridge and the temperature characteristics of the offset voltage can be cancelled.

Figure 6:
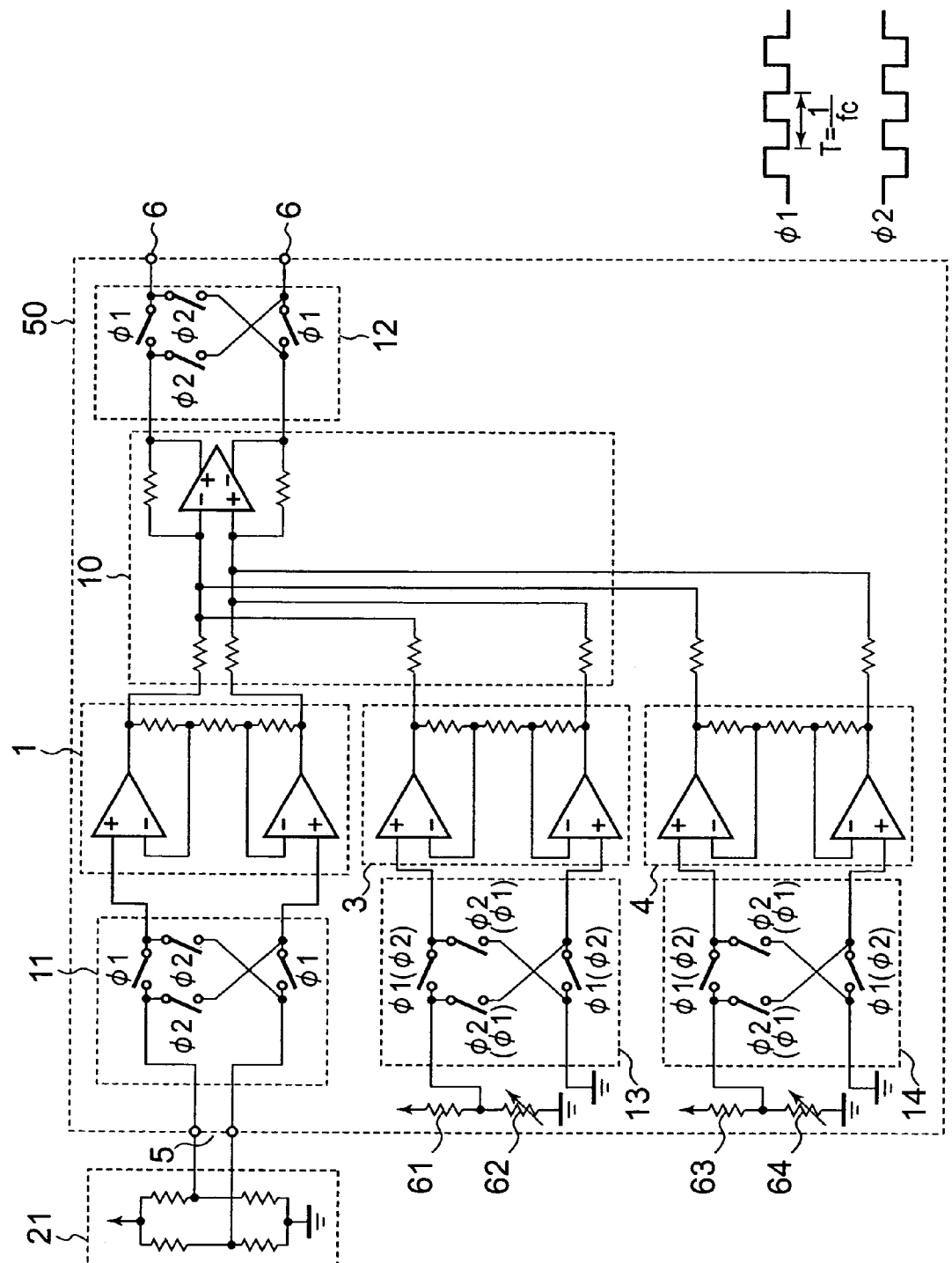
FIG. 6 is a circuit diagram of the chopper amplifier circuit of the second embodiment according to the present invention.

FIG. 6 shows a circuit diagram of the chopper amplifier circuit of the second embodiment according to the present invention.

The multipliers 11, 12, 13, and 14 are respectively composed of four switches. The switches can be realized by an N-channel MOS transistor or a CMOC transistor (in which the N-channel MOS transistor and the P-channel MOS transistor are connected in parallel). The amplifying circuits 1, 3, and 4 have an instrumentation amplifier configuration, whereby an input impedance can be set to be significantly high. Therefore, a sensor bridge using a piezoresistor is not influenced. The adder amplifier circuit 10 can be configured using a resistor and an operational amplifier. As an example of the configuration of the offset temperature characteristics adjusting voltage generation circuit 32, a circuit using two kinds of the resistors 63 and 64 having different resistance temperature coefficients is shown. In a case of forming a resistor of polysilicon, not only a resistance but also a resistance temperature coefficient changes due to the concentration of an impurity contained in polysilicon. Therefore, by allowing the polysilicon resistor 63 and the resistor 64 to have different impurity concentrations, they can have different resistance temperature coefficients.

In FIG. 6, by shifting the phase of a modulation clock of the multiplier 14 by 180°, the same effect as that obtained by inverting the tilt of the offset voltage temperature characteristics generated in the offset temperature characteristics adjusting voltage generation circuit 32 can be obtained. Thus, by appropriately selecting the phase of the modulation clock of the multiplier 14, the same effect can be obtained irrespective of whether the tilt of the offset voltage temperature characteristics of the sensor bridge is positive or negative.

The circuit shown in FIG. 6 is an example obtained by realizing the circuit configuration in FIG. 5, and the present invention is not limited to the circuit configuration shown in FIG. 6.

What is claimed is:

1. A chopper amplifier circuit for amplifying a signal output from a sensor bridge, comprising:
    an offset adjusting voltage generation circuit,
    wherein an offset voltage of the sensor bridge is cancelled with an offset adjusting voltage generated by the offset adjusting voltage generation circuit, and
    wherein the offset adjusting voltage is equal in magnitude to the offset voltage of the sensor bridge, and has a polarity opposite to a polarity of the offset voltage.

2. A chopper amplifier circuit for amplifying a signal output from a sensor bridge, comprising:

an offset adjusting voltage generation circuit, wherein an offset voltage of the sensor bridge is cancelled with an offset adjusting voltage generated by the offset adjusting voltage generation circuit, and wherein the offset adjusting voltage is equal in magnitude to the offset voltage of the sensor bridge, and has a polarity identical to a polarity of the offset voltage.

3. A chopper amplifier circuit according to claim 1, wherein temperature characteristics of the offset voltage of the sensor bridge are cancelled with an offset temperature characteristics adjusting voltage.

4. A chopper amplifier circuit according to claim 3, wherein the offset temperature characteristics adjusting voltage is equal in magnitude to the offset voltage, and has temperature characteristics with a tilt equal to that of the temperature characteristics of the offset voltage.

5. A chopper amplifier circuit according to claim 3, wherein the offset temperature characteristics adjusting voltage is equal in magnitude to the offset voltage, and has temperature characteristics with a tilt reversed with respect to that of the temperature characteristics of the offset voltage.

6. A chopper amplifier circuit, comprising:

an input terminal for inputting a sensor signal output from a sensor bridge;

a first multiplier connected to the input terminal;

a first amplifying circuit connected to the first multiplier;

an offset adjusting voltage generation circuit;

a third multiplier connected to the offset adjusting voltage generation circuit;

a third amplifying circuit connected to the third multiplier;

an adder for adding an output of the first amplifying circuit and an output of the third amplifying circuit;

a second amplifying circuit connected to the adder; and a second multiplier connected to the second amplifying circuit.

7. A chopper amplifier circuit according to claim 6, further comprising:

an offset temperature characteristics adjusting voltage generation circuit;

a fourth multiplier connected to the offset temperature characteristics adjusting voltage generation circuit; and a fourth amplifying circuit connected to the fourth multiplier, wherein an output of the fourth amplifying circuit is added in the adder.

* * * * *